United States Patent
Cheng et al.

(10) Patent No.: US 9,254,997 B2
(45) Date of Patent: Feb. 9, 2016

(54) CMOS-MEMS INTEGRATED FLOW FOR MAKING A PRESSURE SENSITIVE TRANSDUCER

(71) Applicant: Taiwan Semiconductor Manufacturing Co., Ltd., Hsin-Chu (TW)

(72) Inventors: Chun-Wen Cheng, Zhubei (TW); Kai-Chih Liang, Zhubei (TW); Chia-Hua Chu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 14/013,080

(22) Filed: Aug. 29, 2013

(65) Prior Publication Data

US 2015/0060954 A1    Mar. 5, 2015

(51) Int. Cl.
*H01L 29/66* (2006.01)
*B81C 1/00* (2006.01)

(52) U.S. Cl.
CPC ..... *B81C 1/00238* (2013.01); *B81B 2201/0264* (2013.01)

(58) Field of Classification Search
CPC ...... B81B 7/02; B81B 3/0021; B81C 1/0023; B81C 1/00238; H01L 2924/1461
USPC ....................................................... 257/252
See application file for complete search history.

(56) References Cited

U.S. PATENT DOCUMENTS

| | | | | |
|---|---|---|---|---|
| 7,442,570 | B2 * | 10/2008 | Nasiri et al. | 438/48 |
| 8,692,340 | B1 * | 4/2014 | Ata et al. | 257/416 |
| 2004/0227591 | A1 * | 11/2004 | Aigner et al. | 333/191 |
| 2005/0032266 | A1 * | 2/2005 | Suzuki | 438/50 |
| 2009/0285418 | A1 * | 11/2009 | Klinghult | 381/173 |
| 2010/0117168 | A1 * | 5/2010 | Wu et al. | 257/416 |
| 2010/0295138 | A1 * | 11/2010 | Montanya Silvestre et al. | 257/415 |
| 2012/0086127 | A1 * | 4/2012 | Shu et al. | 257/773 |

* cited by examiner

*Primary Examiner* — Ajay K Arora
(74) *Attorney, Agent, or Firm* — Eschweiler & Associates, LLC

(57) ABSTRACT

A sensor is made up of two substrates which are adhered together. A first substrate includes a pressure-sensitive micro-electrical-mechanical (MEMS) structure and a conductive contact structure that protrudes outwardly beyond a first face of the first substrate. A second substrate includes a complementary metal oxide semiconductor (CMOS) device and a receiving structure made up of sidewalls that meet a conductive surface which is recessed from a first face of the second substrate. A conductive bonding material physically adheres the conductive contact structure to the conductive surface and electrically couples the MEMS structure to the CMOS device.

20 Claims, 18 Drawing Sheets

CMOS-MEMS INTEGRATED FLOW FOR MAKING A PRESSURE SENSITIVE TRANSDUCER

BACKGROUND

To help streamline the manufacturing process of such devices on a single integrated circuit, the inventors have developed improved manufacturing processes.

DETAILED DESCRIPTION

Figure 1:
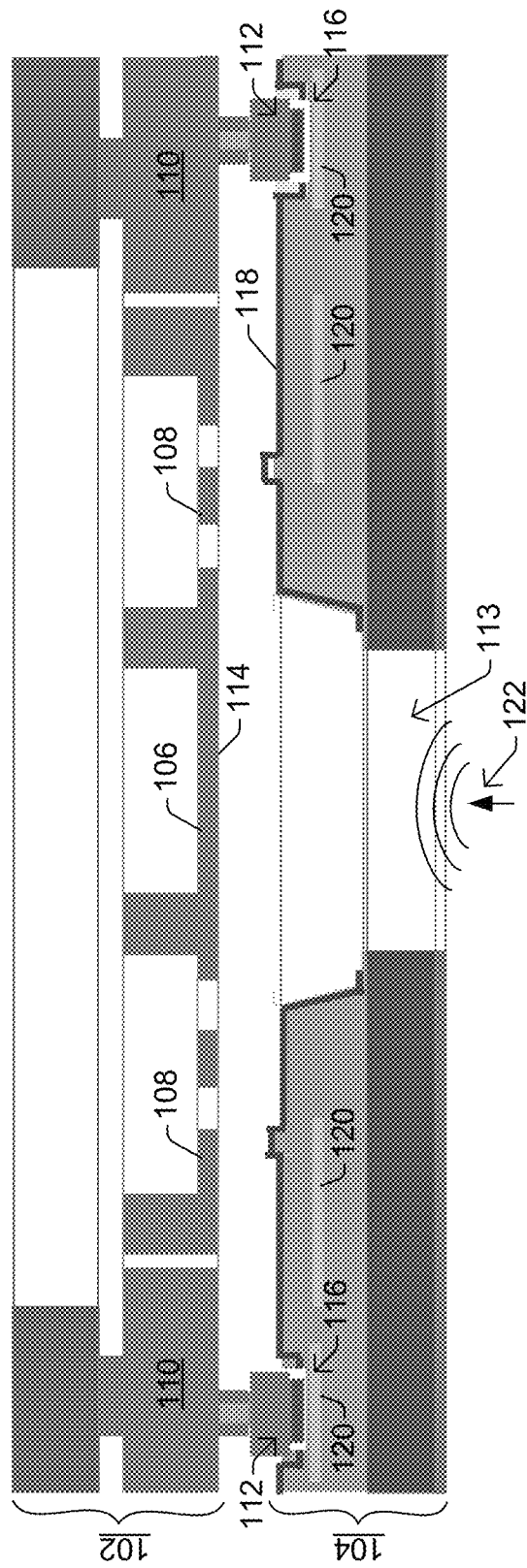
FIG. 1 shows a cross-sectional view of some embodiments of a sensor 100 made up of two substrates which are adhered together.

One or more implementations of the present invention will now be described with reference to the attached drawings, wherein like reference numerals are used to refer to like elements throughout. The drawings are not drawn to scale.

FIG. 1 shows a cross-sectional view of some embodiments of a sensor 100 made up of two substrates which are adhered together—namely a first substrate 102 that includes a MEMS sensor and a second substrate 104 that includes one or more complementary metal oxide semiconductor (CMOS) devices. On the first substrate 102, the MEMS device includes a conductive membrane 106 supported by a conductive cantilever support structure 108 and a conductive anchor structure 110. Conductive contacts 112 protrude outwardly beyond a substantially planar surface 114 on the first substrate 102. On the second substrate 104, an aperture 113 is aligned with the conductive membrane and allows sound to pass through the first substrate 102 to reach the conductive membrane 106. A conductive receiving structure 116, which is recessed relative to a substantially planar surface 118, puts the conductive membrane 106 in electrical contact with CMOS devices on the second substrate 104. For example, in the illustrated embodiment, the conductive contacts 112 are in electrical contact with an uppermost metal layer 120 (e.g., a copper or aluminum layer) on the second substrate 104.

In some embodiments, the sensor 100 can act as a microphone that converts sound into an electrical signal, although other applications are also possible. During microphone operation, sound in the form of a time-varying pressure wave (e.g., 122) can pass through aperture 113 and strike the conductive membrane 106, thereby causing small displacements in the conductive membrane 106 relative to uppermost metal layer 120. The magnitude and frequency of these displacements correspond to the volume and pitch of an impingent sound wave. To convert these displacements into an electrical signal, a CMOS circuit on second substrate 104 measures the time-varying capacitance between the conductive membrane 106 and the uppermost metal layer 120. For example, the CMOS circuit can supply a predetermined charge to the conductive membrane 106 in time (e.g., a predetermined current through uppermost metal layer 120, conductive contact 112, anchor 110, cantilever support structure 108 and membrane 106), and monitor how a voltage changes between the conductive membrane 106 and uppermost metal layer 120 as a function of the charge. By taking regular current and voltage measurements, the CMOS circuit can track the capacitance according to the voltage/current relationship:

$$I(t) = C\frac{dV(t)}{dt}$$

where C is the capacitance. Because the time-varying capacitance reflects the time-varying distance between the conductive membrane 106 and uppermost metal layer 120 (and this distance changes in time based on the impingent sound wave), the CMOS circuit can thereby provide an electrical signal representative of sound impingent on the conductive membrane 106.

To provide end customers with a streamlined solution, in some embodiments, the second substrate 104 can include circuitry for processing the electrical signal. For example, the second substrate 104 can include an analog-to-digital converter (ADC), and/or analog or digital acoustic filters for removing noise from the signals, and/or other signal processing circuitry.

Figure 2:
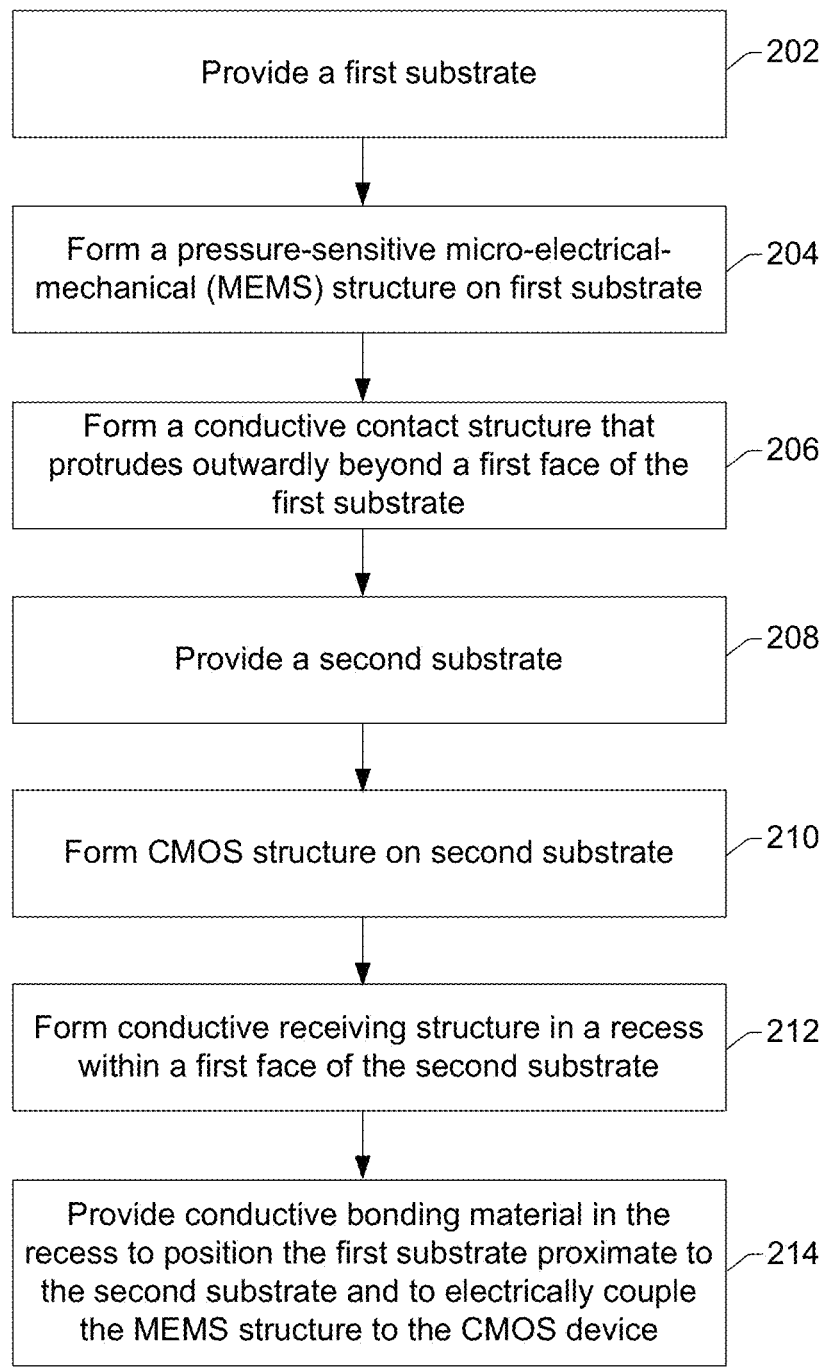
FIG. 2 illustrates some embodiments of a manufacturing method in flowchart format.

To illustrate some embodiments of how such a sensor can be manufactured, FIG. 2 illustrates a somewhat general manufacturing method in flowchart format while FIGS. 3-33 collectively illustrate a more detailed manufacturing method as a series of cross-sectional views. It will be appreciated that although these methods each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

Turning now to FIG. 2, method 200 starts at 202 when a first substrate is provided. In 204, a pressure sensitive MEMS structure is formed on the first substrate. In some embodiments, the pressure sensitive MEMS structure can be a conductive membrane, such as previously illustrated in FIG. 1 for example. In 206, a conductive contact structure is formed. This conductive contact structure protrudes outwardly beyond a first face of the first substrate. In 208, a second substrate is provided, and in 210 a CMOS structure is formed on the second substrate. In 212, a conductive receiving structure is formed on a recess within a first face of the second substrate. In 214, a conductive bonding material, such as a eutectic bonding material in the recess, is used to adhere the first substrate proximate to the second substrate and to electrically couple the MEMs structure to the CMOS device. This method 200 provides streamlined integration of MEMS and CMOS technology so a manufacturer can deliver a single package with good functionality to end customers.

FIGS. 3-33 collectively illustrate a more detailed manufacturing method in accordance with some embodiments. Generally speaking, FIGS. 3-17 depict acts for manufacturing a MEMS structure on a first substrate, FIGS. 18-26 depict acts for manufacturing a CMOS device, and FIGS. 27-33 depicts acts for bonding the first and second substrates and processing those substrates while bonded.

Figure 3:
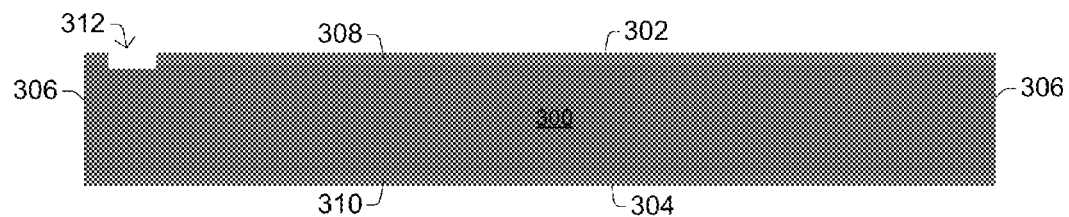
FIGS. 3-33 collectively illustrate a series of cross-sectional views of some embodiments of a manufacturing method.

More particularly, FIG. 3 illustrates a monolithic silicon wafer 300 having opposing faces 302, 304, which are bounded by a perimetric (e.g., circumferential) edge 306. Protective oxide layers 308, 310 are present on the opposing faces, and an alignment feature 312 is formed on the first face 302.

Figure 4:
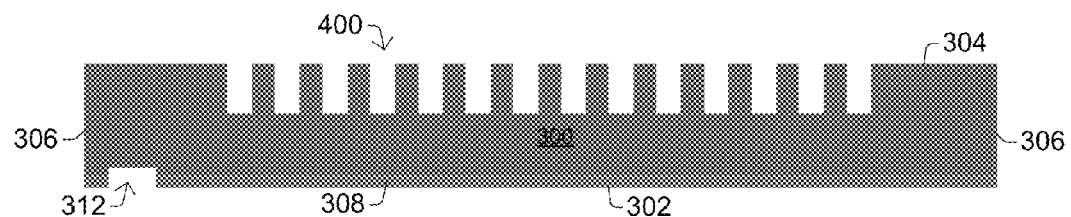

In FIG. 4, the wafer 300 has been flipped over, and the protective oxide 310 has been removed. A series of recesses or grooves 402 (e.g., corresponding to metal 2 vias) are formed on the second face. In some embodiments, each recess has a length of approximately 2 microns and a width of approximately 4 microns, and a depth of approximately 30 microns to 50 microns.

Figure 5:
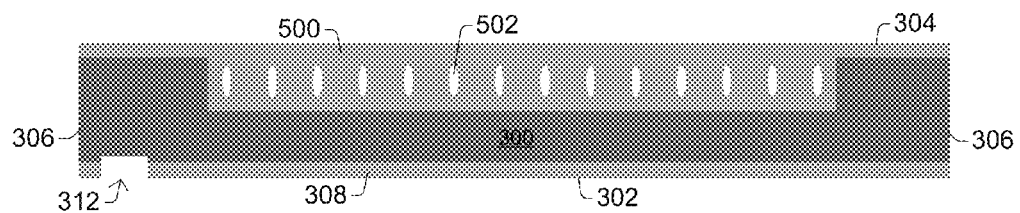

In FIG. 5, an oxide 500 is formed over the second face. As it forms, the oxide tends to "pinch off" the top of the recesses, thereby leaving an air gap in the central region of each recess. These air gaps are advantageous in that they allow a subsequent etching process (see e.g., FIGS. 32-33) to easily remove this oxide to "free" a conductive membrane of the MEMS device from the surrounding wafer features. After the oxide has been formed, it can be chemically mechanically polished (CMPed), so approximately 1 micron of oxide remains on the second face of the silicon wafer.

Figure 6:
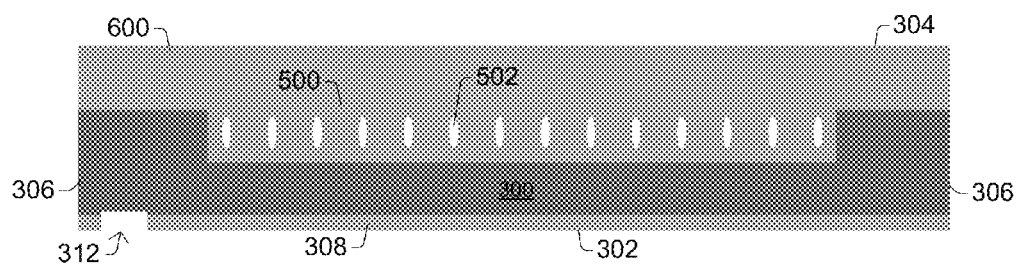

In FIG. 6, a frame oxide layer 600 is deposited on the second face of the wafer.

Figure 7:
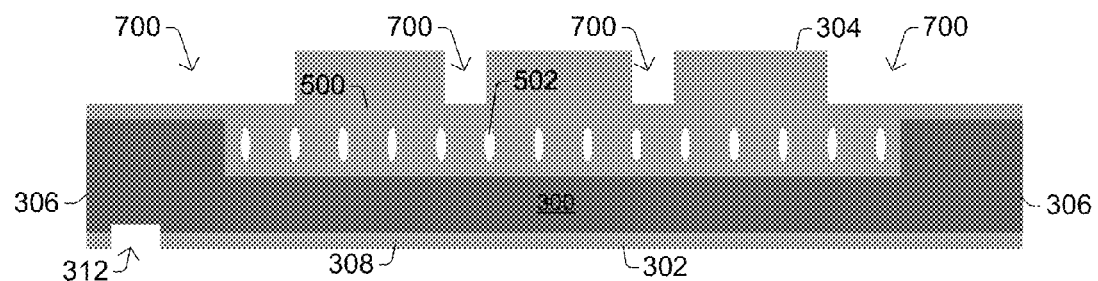

In FIG. 7, a mask (not shown) is patterned over the frame oxide layer using photolithography techniques, and an etch is carried out to form a series of frame recesses 700.

Figure 8:
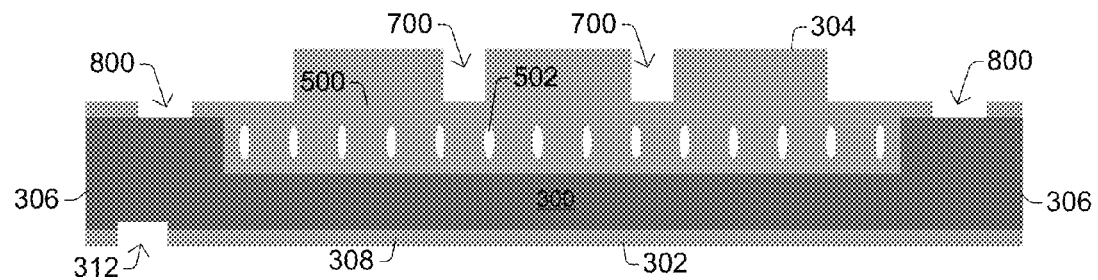

In FIG. 8, another patterning step is carried out, and contact holes 800 are etched through the frame oxide near step-regions of the silicon wafer.

Figure 9:
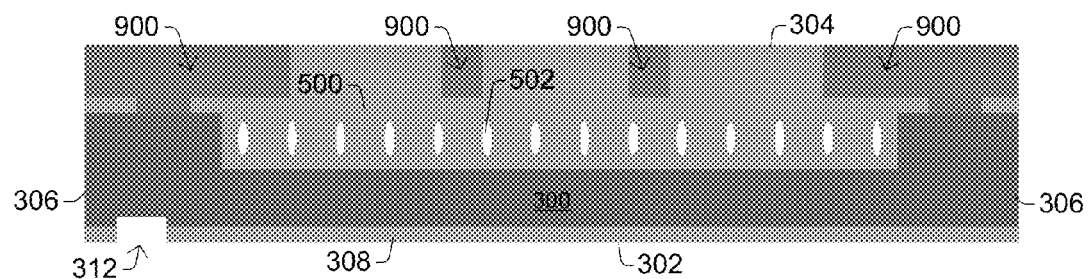

In FIG. 9, a thick polysilicon layer 900 is deposited on the second face of the wafer, and is then CMPed back. In this way, polysilicon anchors are formed over the contact holes.

Figure 10:
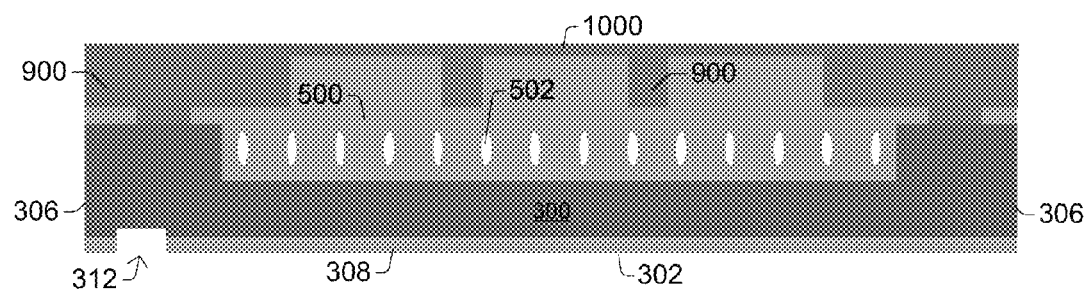

In FIG. 10, a thin layer of polysilicon is deposited over the second face of the wafer. After being subsequently patterned, this thin layer of polysilicon will act as the conductive membrane that constitutes a capacitive plate of the MEMS device.

Figure 11:
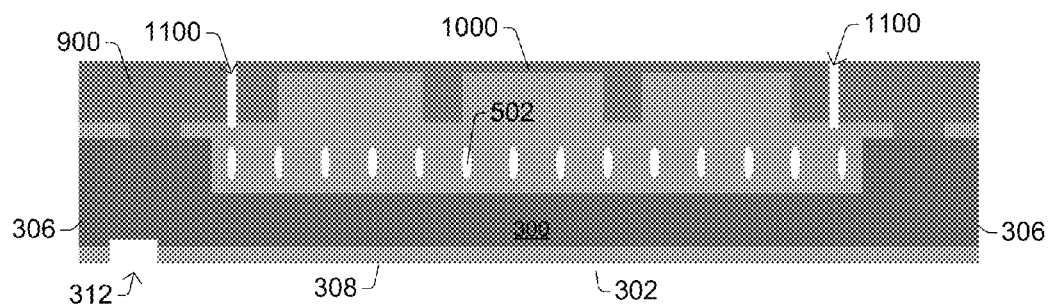

In FIG. 11, another patterning step is carried out, and holes or narrow trenches are etched to form a gap feature in between moving parts and stationary parts.

Figure 12:
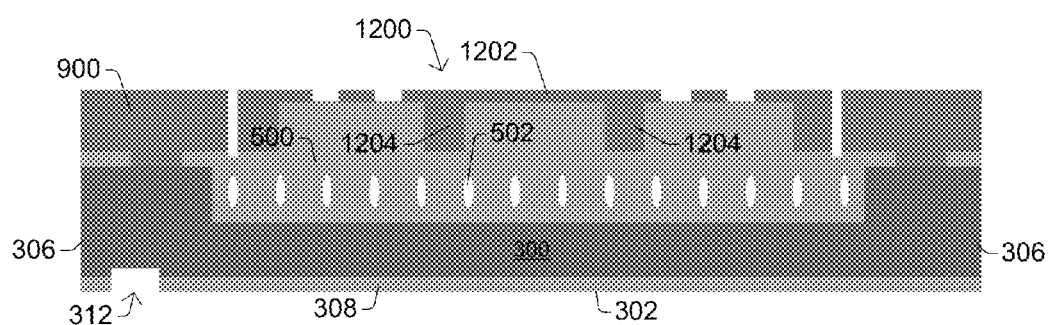

In FIG. 12, another patterning step is carried out, and holes are formed to define the conductive membrane 1200 is formed. The conductive membrane 1200 includes a thin conductive membrane 1202 which extends in a first direction (e.g., horizontally) with a thicker wall region 1204 near an outer edge thereof. In some embodiments, the thicker wall region 1204 can extend around an entire perimeter of the conductive membrane 1202, for example in a circular or polygonal (e.g., square or rectangular) shape, which aids in pressure sensing.

Figure 13:
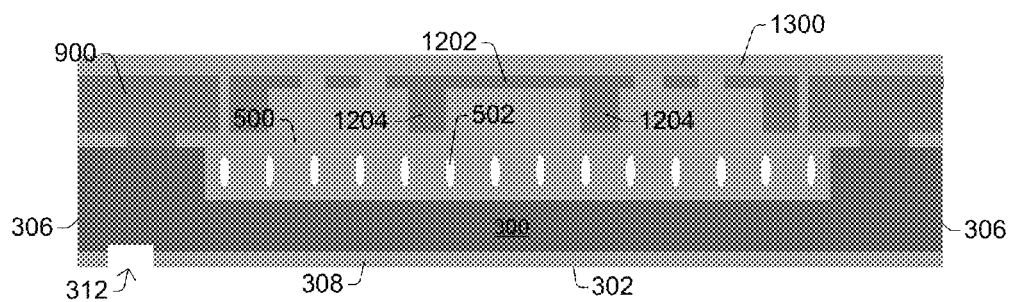

In FIG. 13, another oxide layer 1300 is formed over the conductive membrane 1202, and CMP is carried out.

Figure 14:
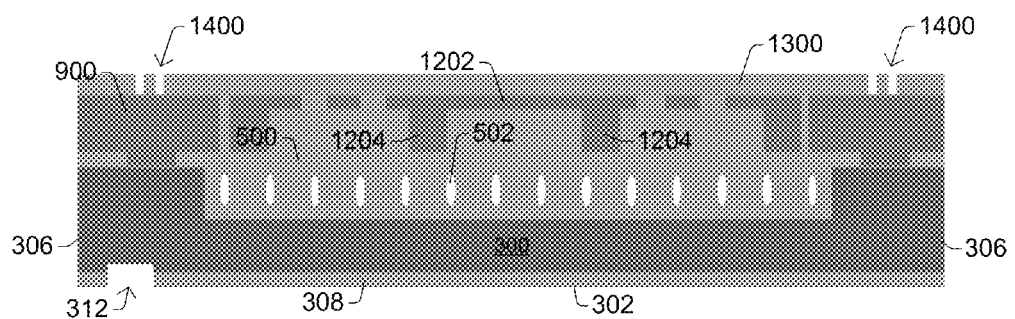

In FIG. 14, vias 1400 are formed through the oxide layer 1300 so as to extend down to an upper region of the polysilicon anchor regions 900.

Figure 15:
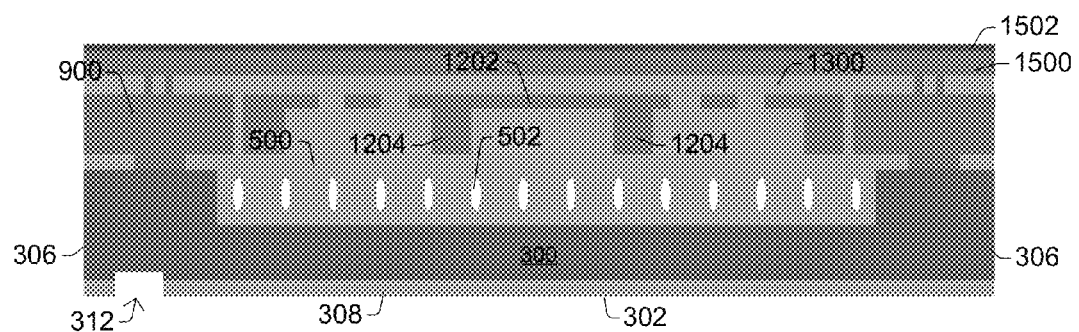

In FIG. 15, another polysilicon layer 1500 is deposited, followed by the formation of a germanium layer 1502. The germanium layer 1502 can be sputtered on in some embodiments. In subsequent processing, the polysilicon layer and germanium layer help to form a conductive, hermetic seal with another surface (e.g., another wafer).

Figure 16:
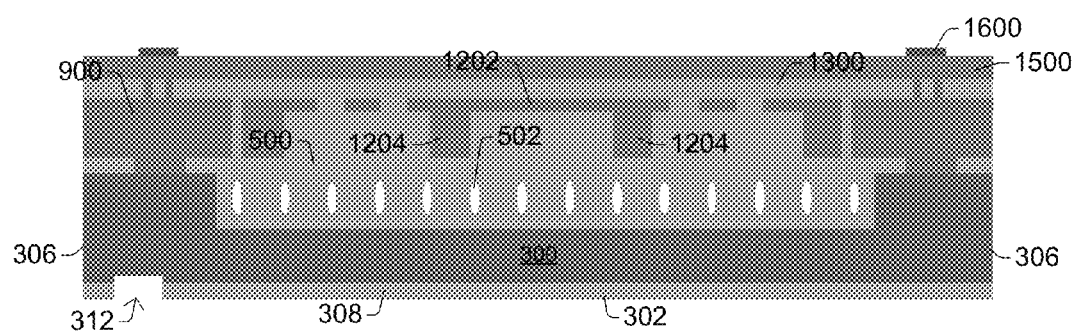
Figure 17:
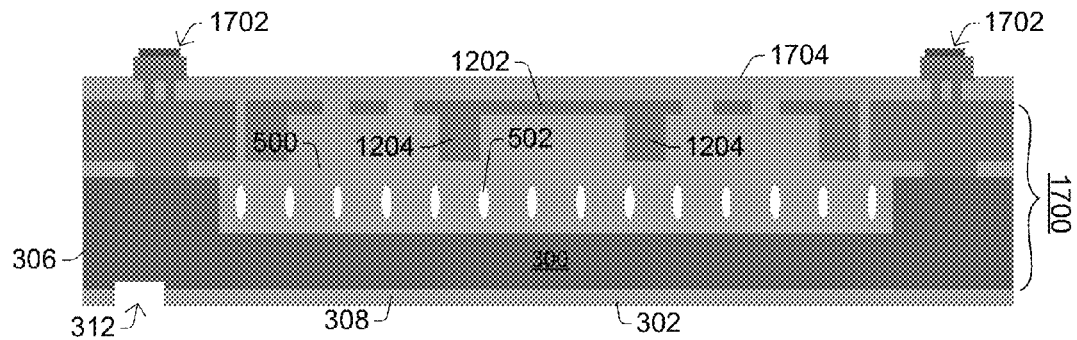
Figure 18:
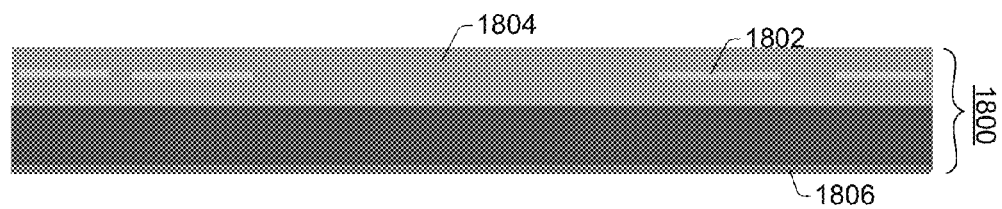

In FIG. 16, the germanium layer 1502 is patterned to form a germanium pad 1600, and in FIG. 17, the polysilicon underlying the germanium pad is patterned and etched to form conductive contacts 1702 that protrude outwardly beyond a surface 1704 of the first substrate. Hence, a first substrate/wafer 1700. is formed FIG. 18 illustrates a second substrate 1800, which includes active device features and an uppermost metal layer 1802, such as a copper and/or aluminum layer. For simplicity, device features are not illustrated in FIG. 18, however, the devices (e.g., MOSFETs, FinFETs, BJTs, diodes, or JFETS) can include conductive regions formed in the substrate 1800 (e.g., n-doped and p-doped regions), as well as alternating conducting and insulating layers under the uppermost metal layer 1802. A passivation layer 1804, which can protect the CMOS devices from environmental conditions, can be on a first (e.g., uppermost) surface of the second substrate, while a protective layer 1806 (e.g., oxide) is present on a second (e.g., bottom) surface of the second substrate.

Figure 19:
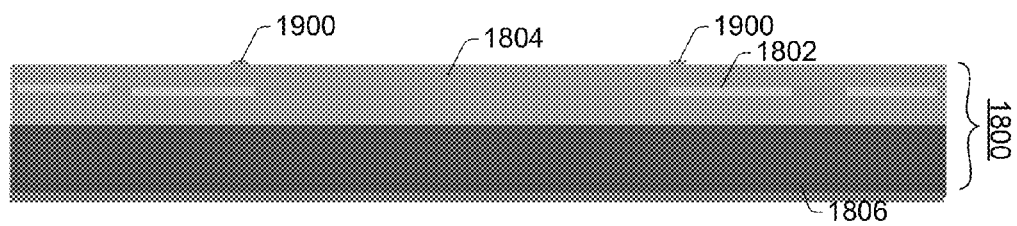

In FIG. 19, a patterning step is performed, and an etch is performed while the mask is in place to form bumps 1900 on the first substrate surface. The function of bumps 1900 is to prevent membrane stiction when the membrane 106 is vibrated with large deformation.

Figure 20:
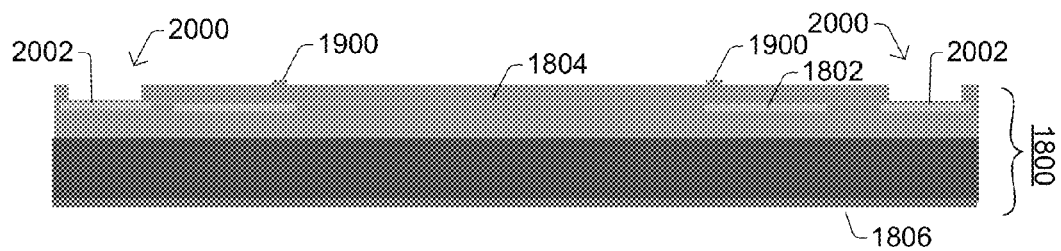

In FIG. 20, a patterning step is performed to leave openings 2000 corresponding to pad regions in the uppermost metal layer. An etch is performed to remove the passivation layer in these regions, thereby exposing the conductive pad regions 2002.

Figure 21:
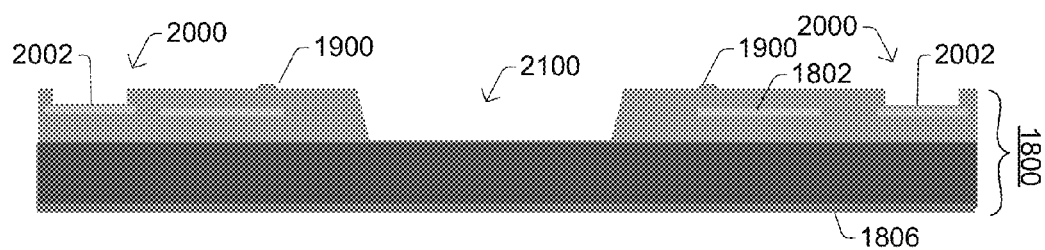

In FIG. 21, another mask is patterned, and an etch, which is selective between the passivation layer 1804 and silicon, is used to form a cavity 2100 in the second substrate.

Figure 22:
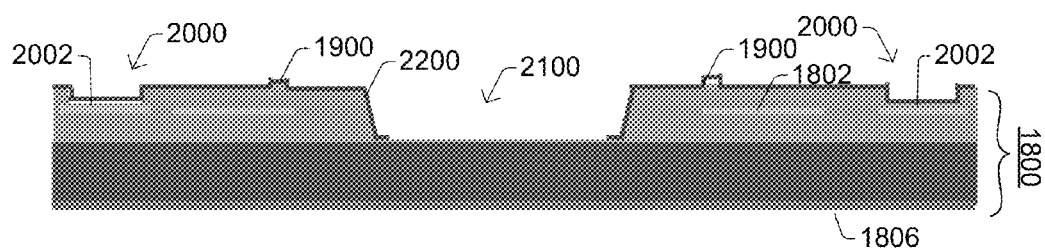

In FIG. 22, a vapor hydro-fluoric (vHF) barrier layer 2200 is formed over the second surface.

Figure 23:
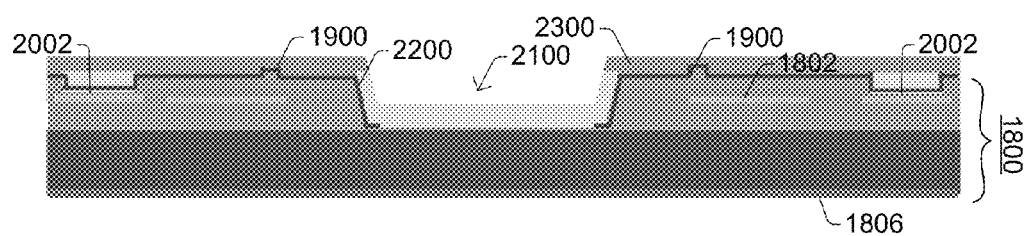

In FIG. 23, a thick oxide 2300 is formed over the vHF layer 2200 and over the remainder of the second surface.

Figure 24:
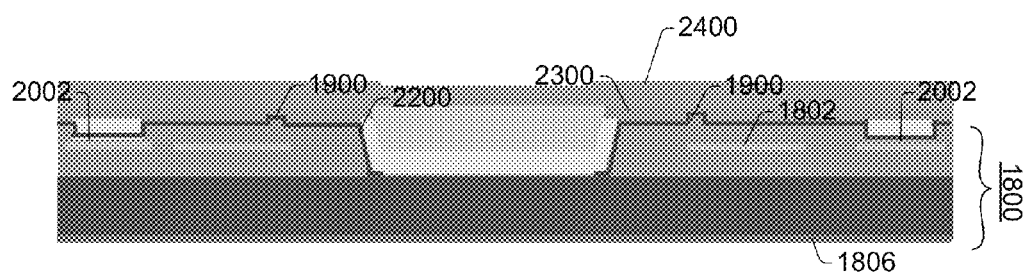
Figure 25:
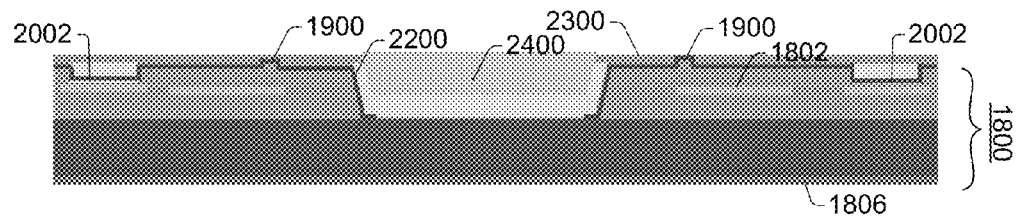

In FIG. 24, a photoresist coating 2400 is patterned, and in FIG. 25, the oxide is etched with the patterned photoresist in place.

Figure 26:
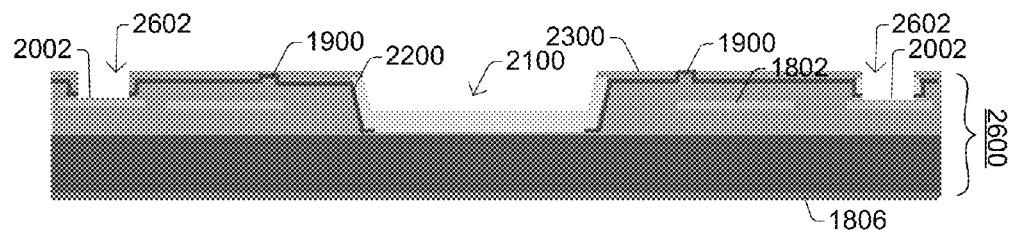

In FIG. 26, a selective etch is carried out to remove the oxide to form holes 2602. Hence, second substrate/wafer 2600 is formed.

Figure 27:
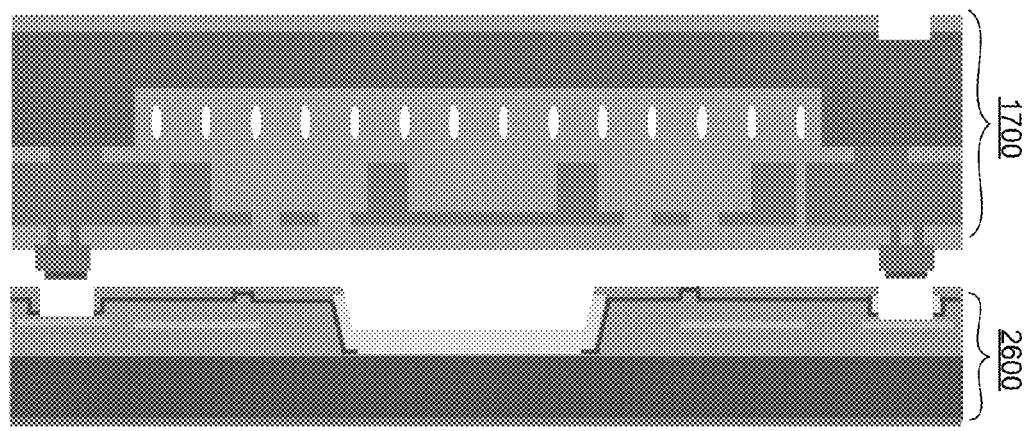
Figure 28:
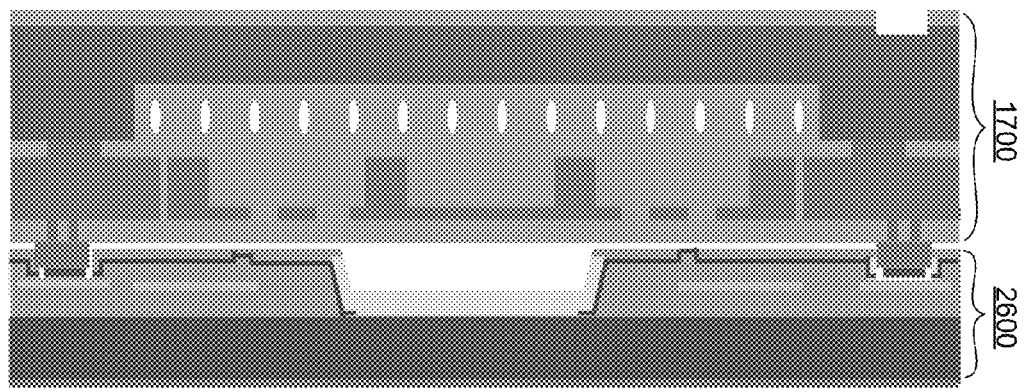

In FIGS. 27-28, the first and second wafers (1700 from FIGS. 17 and 2600 from FIG. 26, respectively) are bonded. This bonding occurs when a conductive bonding material in the recess is used to position the first substrate proximate to the second substrate and to electrically couple the MEMS structure to the CMOS device. For example, in some embodiments a eutectic alloy can be formed in the recess by sputtering, dual source evaporation or electroplating. Eutectic alloys also can be formed by diffusion reactions of pure materials and subsequently melting of the eutectic composition. When used, eutectic bonding is able to produce hermetically sealed packages and electrical interconnection within a single process. In addition, eutectic bonding provides conductive conducts at low processing temperatures, induces low stress in final assembly, and provides high strength bonds with good reliability. Note that FIG. 27 shows the first and second wafers 1700, 2600 just prior to eutectic bonding, and FIG. 28 shows the first and second wafers 1700, 2600 just after eutectic bonding.

Figure 29:
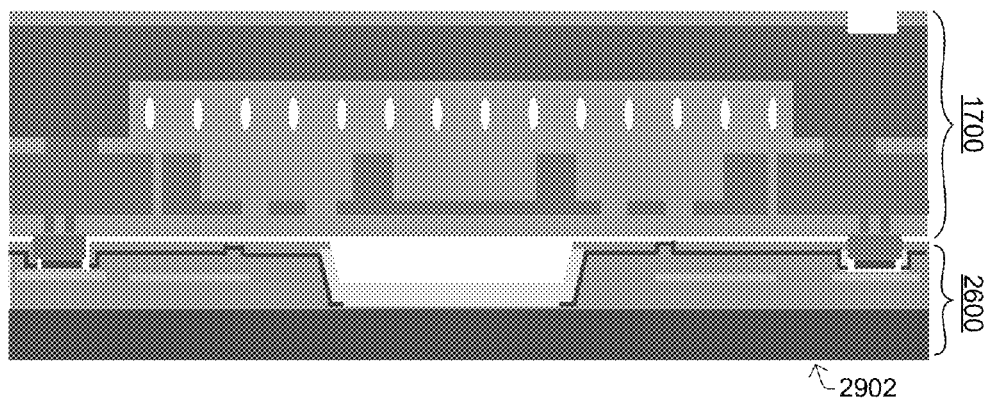
Figure 30:
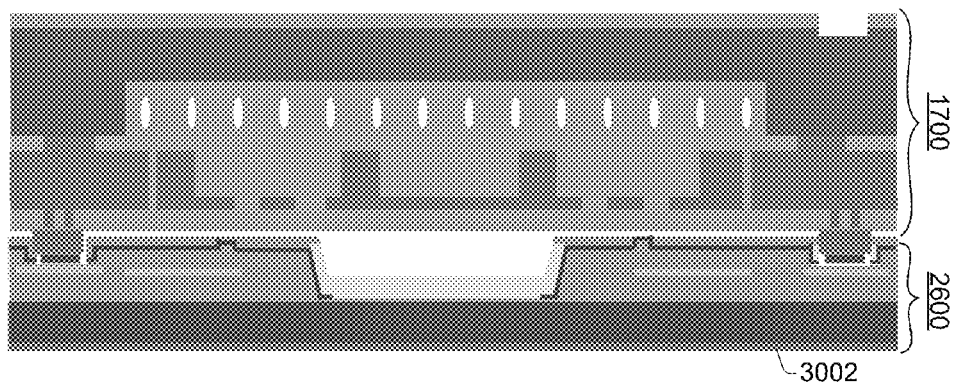

In FIG. 29, a backside 2902 of the second (CMOS) wafer is thinned, and in FIG. 30 a thin oxide layer 3002 is deposited.

Figure 31:
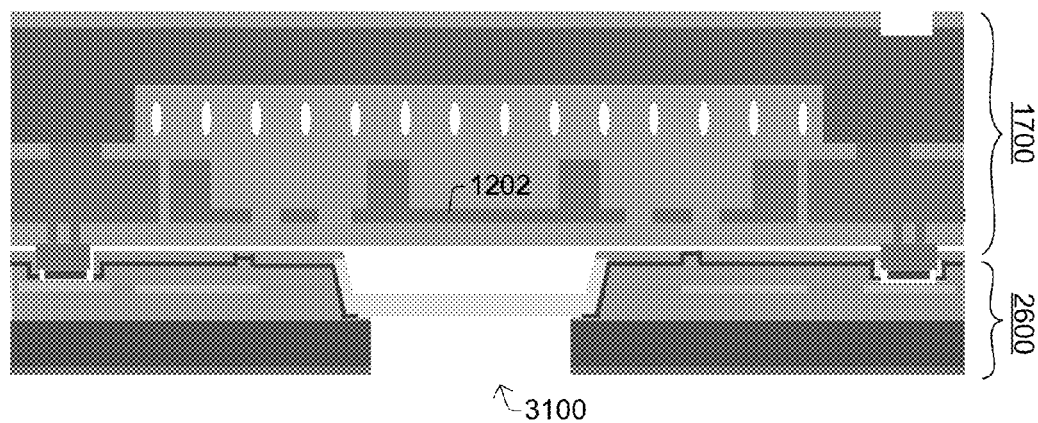

In FIG. 31, an etch is carried out to remove the oxide and silicon, so as to form an aperture 3100 in the second wafer aligned to the conductive membrane 1202, which is yet freed from its surrounding oxide/protective layer.

Figure 32:
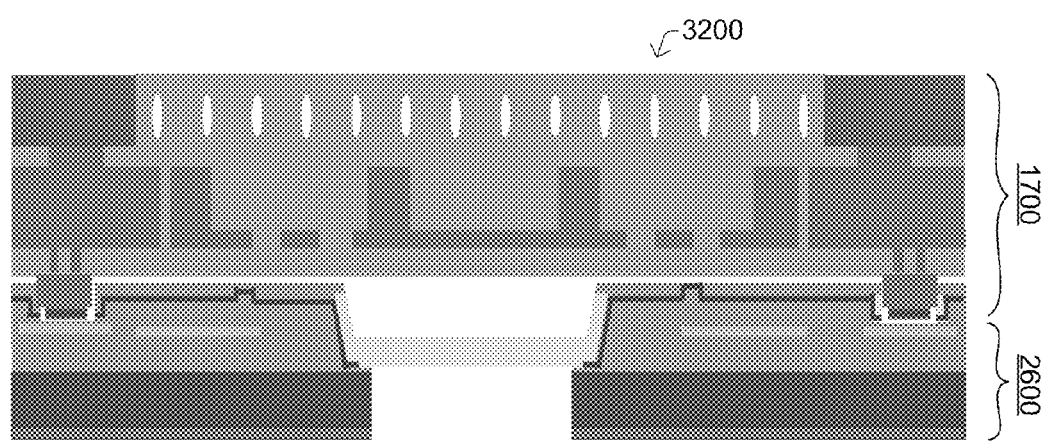

In FIG. 32, a backside 3200 of the first (MEMS) wafer is grinded or etched.

Figure 33:
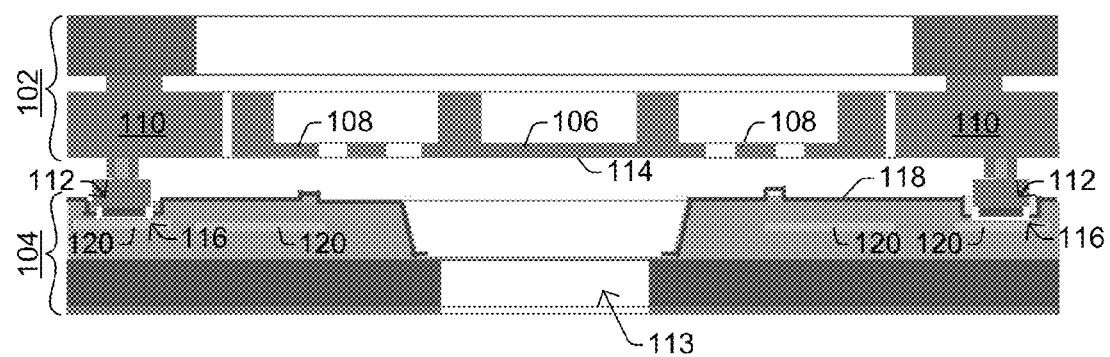

In FIG. 33, a vapor hydro-fluoric etch is performed to release the conductive membrane 1202 from its surrounding oxide/protective layer. Thus, the conductive membrane 1202 can be exposed to ambient environmental conditions from an upper direction and a lower direction after the vHF etch is performed.

Thus, it will be appreciated that some embodiments relate to a sensor made up of two substrates which are adhered together. A first substrate includes a pressure-sensitive microelectrical-mechanical (MEMS) structure and a conductive contact structure that protrudes outwardly beyond a first face of the first substrate. A second substrate includes a complementary metal oxide semiconductor (CMOS) device and a receiving structure made up of sidewalls that meet a conductive surface which is recessed from a first face of the second substrate. A conductive bonding material physically adheres the conductive contact structure to the conductive surface and electrically couples the MEMS structure to the CMOS device.

Other embodiments relate to a method. In this method, a first substrate is processed to form a pressure-sensitive micro-electrical-mechanical (MEMS) structure. A first face of the first substrate includes a substantially planar dielectric region with a conductive contact structure which extends through the substantially planar dielectric region and which protrudes outwardly beyond the substantially planar dielectric region. A second substrate is then processed to form a complementary metal oxide semiconductor (CMOS) device. A first face on the second substrate includes a conductive receiving structure that is recessed relative to the first face for the second substrate. The first face of the first substrate is bonded to the first face of the second substrate such that the conductive contact structure of the first substrate is received within the conductive receiving structure.

Still other embodiments relate to a sensor. The sensor includes a first substrate including: a conductive contact structure which protrudes outwardly beyond a face of the first substrate and which is electrically coupled to a conductive membrane. The conductive membrane acts as a first capacitive plate on the first substrate. The sensor also includes a second substrate including: a receiving structure having a conductive surface which is recessed from a first face of the second substrate by sidewalls and which is electrically coupled to a metal layer. The metal layer acts as a second capacitive plate on the second substrate. A circuit on the second substrate supplies a predetermined charge to the conductive membrane and monitors how a voltage changes between the conductive membrane and the metal layer as a function of the predetermined charge.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

Further, it will be appreciated that "semiconductor substrate" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor substrate can also include non semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sensor, comprising:
   a first substrate including a conductive layer vertically arranged between a semiconductor layer and a conductive contact structure, wherein the conductive layer includes stationary regions and a movable region extending laterally between the stationary regions, wherein the movable region includes a plurality of recesses extending downwardly into an upper side of the conductive layer, wherein some of the plurality of recesses taper inwardly to adjoin openings extending through perforated regions in a lower side of the conductive layer and other of the plurality of recesses terminate at an upper surface of a conductive membrane of the conductive layer that is laterally arranged between the perforated regions, wherein the conductive contact structure protrudes outwardly from a lower side of the conductive layer, beyond a face of the first substrate, and wherein the conductive contact structure is electrically coupled to a pressure-sensitive micro-electrical-mechanical (MEMS) structure on the first substrate;
   a second substrate including a receiving structure having a conductive surface which is recessed from a face of the second substrate by sidewalls that bound the conductive surface, wherein the conductive surface is electrically coupled to a complementary metal oxide semiconductor (CMOS) device on the second substrate; and
   a conductive bonding material to physically adhere the conductive contact structure to the conductive surface and to electrically couple the MEMS structure to the CMOS device.

2. The sensor of claim 1, wherein the sensor includes a capacitive sensing element comprising:
   the conductive membrane, which acts as a first capacitive plate, arranged on the first substrate; and
   a metal layer, which acts as a second capacitive plate, arranged on the second substrate.

3. The sensor of claim 2, wherein the movable region further comprises a conductive cantilever support structure which physically supports and is electrically coupled to the conductive membrane, and wherein the stationary region includes a conductive anchor structure arranged to physically support the conductive cantilever support structure and to electrically couple the conductive cantilever support structure to the conductive contact structure.

4. The sensor of claim 3, wherein the second substrate includes an aperture which is aligned to the conductive membrane when the first and second substrates are physically adhered to one another.

5. The sensor of claim 4, where the second substrate further comprises:
 a CMOS circuit configured to supply a predetermined charge to the conductive membrane and to monitor how a voltage changes between the conductive membrane and the metal layer as a function of the predetermined charge.

6. The sensor of claim 2, wherein the second substrate comprises:
 an analog-to-digital converter to digitize an electrical signal related to a position of the conductive membrane in time; and
 an analog or digital acoustic filter.

7. The sensor of claim 1, wherein the receiving structure comprises:
 a hydro-fluoric (HF) acid barrier layer that extends laterally along the face of the second substrate and which extends vertically along the sidewall from the face of the second substrate to the recessed conductive surface.

8. The sensor of claim 3, wherein the conductive contact structure comprises:
 a polysilicon body that is vertically spaced from the face of the first substrate by a pair of conductive vias and a dielectric layer, wherein the dielectric layer is arranged laterally between the conductive vias and completely fills a void between the conductive vias, wherein the conductive vias couple the polysilicon body to the conductive anchor structure; and
 a germanium pad coupling the polysilicon body to the conductive surface of the second substrate.

9. A sensor, comprising:
 a first substrate including a conductive contact structure which protrudes outwardly beyond a face of the first substrate and which is electrically coupled to a conductive membrane, which acts as a first capacitive plate, on the first substrate, wherein the conductive contact structure includes a conductive body that is vertically spaced from the face of the first substrate by a pair of vias and a dielectric layer arranged laterally between the vias;
 a second substrate including a receiving structure having a conductive surface which is recessed from a face of the second substrate by sidewalls and which is electrically coupled to a metal layer, which acts as a second capacitive plate, on the second substrate; and
 a circuit on the second substrate and configured to supply a predetermined charge to the conductive membrane and to monitor how a voltage changes between the conductive membrane and the metal layer as a function of the predetermined charge.

10. The sensor of claim 9, further comprising:
 a conductive eutectic bonding material to physically adhere the conductive contact structure to the conductive surface of the receiving structure and to electrically couple the conductive membrane to the circuit.

11. The sensor of claim 10, wherein the conductive body is polysilicon and electrically coupled to the conductive membrane by the vias, and wherein the conductive contact structure further comprises:
 a germanium pad electrically coupling the conductive body to the conductive surface of the second substrate.

12. The sensor of claim 11, wherein the second substrate includes an aperture which is aligned to the conductive membrane when the first and second substrates are physically adhered to one another, and wherein the conductive body and the germanium pad are received in the receiving structure.

13. A sensor, comprising:
 a first substrate including a conductive layer vertically arranged between a semiconductor layer and a polysilicon contact structure, wherein the conductive layer includes stationary regions and a movable region extending laterally between the stationary regions, wherein the semiconductor layer includes a recess arranged over and exposing the movable region, and wherein the polysilicon contact structure protrudes outwardly from the stationary region beyond a face of the first substrate, and wherein the polysilicon contact structure is electrically coupled to a conductive membrane of the movable region, which acts as a first capacitor plate, on the first substrate;
 a second substrate including a receiving structure having a conductive surface which is arranged in a recess in a face of the second substrate and which is electrically coupled to a metal layer, which acts as a second capacitor plate, on the second substrate;
 a germanium pad arranged in the recess and coupling the polysilicon contact structure to the conductive surface of the second substrate; and
 a circuit configured to supply a predetermined charge to the conductive membrane and to monitor how a voltage changed between the conductive membrane and the metal layer as a function of the predetermined charge.

14. The sensor of claim 13, wherein the second substrate includes an aperture extending along an aperture axis, wherein the aperture axis intersects the conductive membrane.

15. The sensor of claim 14, wherein the aperture includes an upper aperture portion and a lower aperture portion, the upper aperture portion being proximate to the face of the first substrate and having opposing sidewalls that are spaced apart by a first distance, and the lower aperture portion having opposing sidewalls that are spaced apart by a second distance that is smaller than the first distance.

16. The sensor of claim 15, wherein the receiving structure comprises:
 a hydro-fluoric (HF) acid barrier layer that extends laterally along the face of the second substrate, wherein the HF acid barrier layer extends vertically into the recess of the second substrate and extends downward along the opposing sidewalls of the upper aperture portion, but does not extend downward along the opposing sidewalls of the lower aperture portion.

17. The sensor of claim 15, wherein the sidewalls of the upper aperture portion taper away from one another closer to the first substrate, and wherein the sidewalls of the lower aperture portion are at least substantially vertical.

18. The sensor of claim 14, wherein the circuit is formed on the second substrate and wherein the second substrate further comprises an analog-to-digital converter and an analog or digital acoustic filter to provide an electrical signal whose amplitude or digital value changed in time to reflect the distance between the first and second capacitor plates.

19. The sensor of claim 9, wherein the first substrate includes a conductive layer vertically arranged between a semiconductor layer and conductive contact structure, wherein the conductive layer includes a stationary region and a movable region laterally arranged between the stationary region, and wherein the stationary region includes protruding regions protruding vertically to the semiconductor layer.

20. The sensor of claim 13, wherein the movable region includes a plurality of recesses extending downwardly into an upper side of the conductive layer, wherein some of the plurality of recesses taper inwardly to adjoin openings extending through perforated regions in a lower side of the conductive layer and other of the plurality of recesses terminate at a continuous upper conductive membrane surface of the conductive layer that is laterally arranged between the perforated regions, and wherein the polysilicon contact structure includes a conductive body on the lower side of the conductive layer that is vertically spaced from the face of the first substrate by a pair of vias and dielectric layer arranged laterally between the vias.

* * * * *